United States Patent

Caubet et al.

(10) Patent No.: US 7,531,447 B2
(45) Date of Patent: May 12, 2009

(54) PROCESS FOR FORMING INTEGRATED CIRCUIT COMPRISING COPPER LINES

(75) Inventors: Pierre Caubet, Le Versoud (FR); Magali Gregoire, Gregoire (FR)

(73) Assignee: STMicroelectronics SA, Montrouge (FR)

( * ) Notice: Subject to any disclaimer, the term of this patent is extended or adjusted under 35 U.S.C. 154(b) by 128 days.

(21) Appl. No.: 11/220,353

(22) Filed: Sep. 6, 2005

(65) Prior Publication Data

US 2006/0060976 A1    Mar. 23, 2006

(30) Foreign Application Priority Data

Sep. 7, 2004    (FR) ................... 04 09467

(51) Int. Cl.
   *H01L 23/538*    (2006.01)
(52) U.S. Cl. .................. 438/633; 438/660; 438/663; 438/687; 257/E23.161
(58) Field of Classification Search ................ 438/633, 438/660, 663, 687; 257/E23.161
   See application file for complete search history.

(56) References Cited

U.S. PATENT DOCUMENTS

| 5,391,517 | A | * | 2/1995 | Gelatos et al. .............. 438/643 |
| 5,895,274 | A | * | 4/1999 | Lane et al. ................... 438/795 |
| 5,913,147 | A | * | 6/1999 | Dubin et al. ................. 438/687 |
| 6,159,857 | A | * | 12/2000 | Liu et al. ..................... 438/687 |
| 6,281,110 | B1 | * | 8/2001 | Kizilyalli et al. ............ 438/622 |
| 6,413,864 | B1 | * | 7/2002 | Pyo ............................ 438/687 |
| 6,440,849 | B1 | * | 8/2002 | Merchant et al. ............ 438/658 |
| 6,451,664 | B1 | * | 9/2002 | Barth et al. ................. 438/396 |
| 6,518,183 | B1 | * | 2/2003 | Chang et al. ................ 438/687 |
| 6,548,395 | B1 | * | 4/2003 | Woo et al. .................... 438/622 |
| 6,562,712 | B2 | * | 5/2003 | Liu et al. ..................... 438/631 |
| 2002/0031911 | A1 | * | 3/2002 | Pyo ............................ 438/687 |
| 2002/0102809 | A1 | * | 8/2002 | Barth et al. ................. 438/393 |
| 2003/0008494 | A1 | * | 1/2003 | Liu et al. ..................... 438/626 |
| 2003/0015793 | A1 | * | 1/2003 | Merchant et al. ............ 257/734 |

FOREIGN PATENT DOCUMENTS

WO    WO 03/073481    9/2003

OTHER PUBLICATIONS

Lin, Jian-Hong et al. "Interfacial Mechanism Studies of Electroless Plated Cu films on *a*-Ta:N Layers Catalyzed by PIII", Journal of Vacuum Science and Technology A. Vacuum, Surfaces and Films, American Institute of Physics, New York, NY, vol. 20, No. 3, May/Jun. 2002, pp. 733-740.

Hsu, Hong-Hui et al., "Electroless Copper Deposition for Ultralarge-Scale Integration", Journal of the Electrochemical Society, Jan. 2001, XP002326820.

French Preliminary Search Report dated Apr. 29, 2005 for French Application No. 04 09467.

* cited by examiner

*Primary Examiner*—George Fourson
(74) *Attorney, Agent, or Firm*—Lisa K. Jorgenson; Jose Gutman; Fleit Gibbons Gutman Bongini & Bianco P.L.

(57) ABSTRACT

An integrated circuit includes copper lines, wherein the crystal structure of the copper has a greater than 30% <001> crystal orientation and a less than 20% <111> crystal orientation.

6 Claims, 1 Drawing Sheet

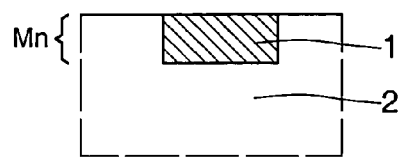
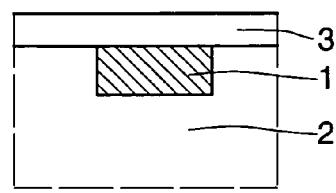
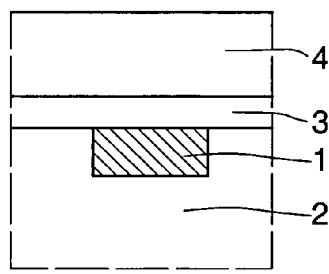
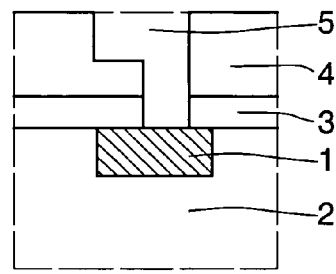
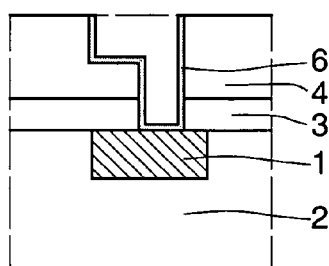
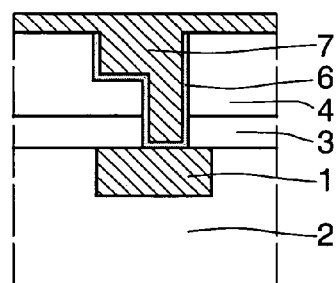
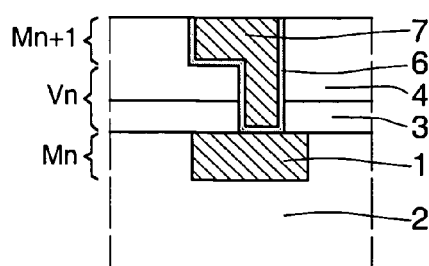
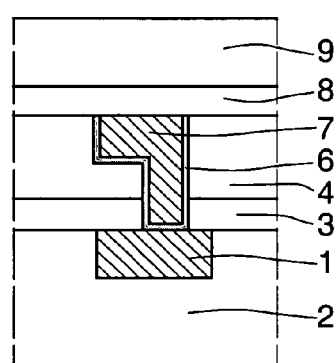

PROCESS FOR FORMING INTEGRATED CIRCUIT COMPRISING COPPER LINES

CROSS-REFERENCE TO RELATED APPLICATION

This application is based upon and claims priority from prior French Patent Application No. 04 09467, filed on Sep. 7, 2004, the entire disclosure of which is herein incorporated by reference.

BACKGROUND OF THE INVENTION

1. Field of the Invention

The present invention relates to the formation of copper lines within an integrated circuit.

2. Description of the Related Art

In integrated circuits comprising copper lines, while layers of dielectrics are being deposited on the copper lines, the formation of copper excrescences also called "hillocks" is observed. The hillocks result from a temperature-activated structural rearrangement of the thin copper layers. They form at the copper grain boundaries, generally during deposition of dielectric layers on the copper lines, after the copper has undergone chemical-mechanical polishing. The hillock density depends on the microstructural properties of the copper deposit.

The effect of the hillocks is deleterious, as they grow between the metal lines and can cause leakage and even short-circuits. This is because the size of the hillocks may be up to 100 nm.

Several attempts have already been made to try to limit the formation of hillocks. It is known that the hillock density can be reduced by modifying the intrinsic copper electroplating parameters or by annealing the copper deposit at various temperatures. It is also known that depositing dielectric layers with $NH_3/H_2$ plasma, or eliminating the annealing step between the copper electroplating and the chemical-mechanical polishing of the copper, results in a reduction in the amount of these defects. It has also been attempted to introduce an annealing step after the chemical-mechanical polishing of the copper.

However, these methods are unsatisfactory, and it appears desirable to have integrated circuits that minimize, or even prevent, the formation of these copper excrescences, and also to have a method for preventing the formation of hillocks, and to do so whatever the thickness and the width of the copper lines.

Accordingly, there exists a need for overcoming the disadvantages of the prior art as discussed above.

SUMMARY OF THE INVENTION

Surprisingly, the Applicant has observed that the density and the size of the hillocks are greatly reduced when the copper exhibits a greater than 30% <001> crystal orientation and a less than 20% <111> crystal orientation.

It has found that this particular copper microstructure makes it possible to limit yield losses in circuits and to improve the reliability of the circuits.

Finally, it has observed that this crystal structure of the copper can be obtained by carrying out, during formation of copper lines, and after depositing copper in trenches, a step of annealing the copper in a gaseous atmosphere consisting of an $N_2/H_2$ mixture containing more than 6% $H_2$, at a temperature between 300 and 450° C., for a time longer than 10 minutes.

The invention therefore proposes an integrated circuit comprising copper lines, the crystal structure of the copper having a greater than 30% <001> crystal orientation and a less than 20% <111> crystal orientation.

The invention also proposes a process for forming copper lines of an integrated circuit, comprising the successive following steps:

a) deposition of copper in trenches, b) annealing of the copper in a gaseous atmosphere consisting of an $N_2/H_2$ mixture containing more than 6% $H_2$, at a temperature between 300 and 450° C., for a time longer than 10 minutes, and c) chemical-mechanical polishing of copper.

In the integrated circuit according to the invention, the copper lines may comprise metal tracks and interconnect vias between the metal tracks of different levels.

In the process according to the invention, the annealing temperature is preferably between 350 and 450° C.

The annealing may be carried out at a pressure between $8 \times 10^4$ and $1.2 \times 10^5$ Pa (i.e. between 600 and 900 torr), and preferably at atmospheric pressure.

Preferably, the annealing step is carried out at the latest 3 days after the deposition of copper, preferably at the latest 8 hours after the deposition of copper, and more preferably directly after the deposition of copper.

Preferably, the phase during which the temperature rises up to the annealing temperature and the phase during which the temperature falls below the annealing temperature are also carried out in a gaseous atmosphere consisting of an $N_2/H_2$ mixture containing more than 6% $H_2$.

BRIEF DESCRIPTION OF THE DRAWINGS

Other advantages and features of the invention will become apparent on examining the detailed description of entirely non-limiting methods of implementation and embodiments, and on examining the appended drawings in which FIGS. 1 to 8 illustrates schematically the main steps of a method of implementing the process of the invention, resulting in an embodiment of an integrated circuit according to the invention.

DETAILED DESCRIPTION

FIGS. 1 to 8 are cross-sectional views of the integrated circuit at various steps in the process for forming copper lines of the invention.

FIG. 1 shows a copper line or track 1 at the metal level $M_n$, the said line or track being surrounded by a dielectric 2. Typically, the dielectric 2 is FSG (fluorinated silica glass).

Next (FIG. 2), an SiN barrier layer 3 is deposited on the line 1 so as to prevent the copper from migrating. The thickness of the barrier layer 3 is for example around 400 Å.

Next (FIG. 3), a layer of dielectric 4 is deposited. The dielectric 4 is preferably FSG and the thickness of the dielectric layer 4 is for example around 85 nm.

Next, the barrier layer 3 and the dielectric layer 4 are etched so as to form a trench 5. The bottom of the trench 5 is formed by the copper line 1 (FIG. 4). The walls of the trench 5 are then coated with a barrier layer 6, as illustrated in FIG. 5. The material constituting the barrier layer 6 is advantageously Ta and/or TaN. It is thus possible to deposit, on the walls of the trench 5, a TaN layer having a thickness of 10 nm and then a Ta layer having a thickness of 15 nm.

Next (FIG. 6), copper 7 is deposited in the trench 5, the walls of which are coated with the barrier layer 6. The copper 7 may be deposited by any technique known to those skilled in the art, and especially by electrodeposition or by CVD (Chemical Vapor Deposition).

Next, the specific annealing of the invention is carried out. The annealing of the copper 7 takes place in a gaseous atmosphere consisting of an $N_2/H_2$ mixture containing more than 6% $H_2$, at a temperature between 300 and 450° C., for a time longer than 10 minutes. Below 300° C., the annealing is ineffective, while above 450° C. it is observed that the dielectrics of the integrated circuit degrade. The annealing temperature is preferably between 350 and 450° C. The time between the annealing and the electroplating step is preferably less than 3 days in order to prevent the copper deposit from degrading.

Thanks to the presence of more than 6% $H_2$ in the gaseous atmosphere, a reduction in the internal stresses in the copper layer 7 is observed, which thus favors an <001> crystal orientation to the detriment of the <111> crystal orientation. This reduction in the internal stresses is accompanied by a limitation in the diffusion effects, by an increase in the grain size and by a reduction in the density and size of the hillocks.

By annealing for 30 minutes, including 14 minutes at 400° C., at atmospheric pressure, and with a copper line thickness of 700 nm, the following crystal structure was observed: <001>: 39.7%; <221>: 33.1%; <110>: 1.8%; <210>: 4.6%; <111> 6.4%; <511>: 5.1%; <211>: 7.5%; <310>: 1.8%.

Next, the copper 7 undergoes a chemical-mechanical polishing step so as to remove the copper 7 covering the dielectric layer 4.

FIG. 7 illustrates the integrated circuit after the chemical-mechanical polishing and annealing steps. The copper track situated at the metal level $M_{n+1}$ is connected to the track of the metal level $M_n$ by means of the via $V_n$.

The fabrication of the integrated circuit, particularly the formation of the upper metal level and the upper via level, continues with the deposition of an SiN barrier layer 8 followed by a dielectric layer 9 (FIG. 8), generally by chemical vapor deposition. The thickness of the barrier layer 8 is around 40 nm. The dielectric 9 is preferably FSG and the thickness of the dielectric layer 9 is around 850 nm.

A substantial reduction in the density and the size of the hillocks is observed during formation of the dielectric 9.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above.

Therefore, it is intended that the present invention not be limited to the particular embodiments disclosed, but that the invention include all embodiments falling within the scope of the appended claims.

What is claimed is:

1. A process for forming copper lines of an integrated circuit, comprising the successive following steps:
   a) deposition of copper in trenches,
   b) annealing of the copper in a gaseous atmosphere consisting of an $N_2/H_2$ mixture containing more than 6% $H_2$, at a temperature between 300 and 450° C., for a time longer than 10minutes, and
   c) chemical-mechanical polishing of copper; and wherein the phase during which the temperature rises up to the annealing temperature and the phase during which the temperature falls below the annealing temperature are also carried out in a gaseous atmosphere consisting of an $N_2/H_2$ mixture containing more than 6% $H_2$.

2. The process according to claim 1, wherein the annealing is carried out at a pressure substantially between $8 \times 10^4$ and $1.2 \times 10^5$ Pa.

3. The process according to claim 1, wherein the annealing is carried out at a pressure substantially at atmospheric pressure.

4. The process according to claim 1, wherein the annealing temperature is substantially between 350 and 450° C.

5. The process according to claim 4, wherein the annealing is carried out at a pressure substantially between $8 \times 10^4$ and $1.2 \times 10^5$ Pa.

6. The process according to claim 4, wherein the annealing is carried out at a pressure substantially at atmospheric pressure

* * * * *